United States Patent
Ibok

(10) Patent No.: US 6,204,157 B1
(45) Date of Patent: Mar. 20, 2001

(54) METHOD FOR ESTABLISHING SHALLOW JUNCTION IN SEMICONDUCTOR DEVICE TO MINIMIZE JUNCTION CAPACITANCE

(75) Inventor: Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/479,492

(22) Filed: Jan. 7, 2000

Related U.S. Application Data

(60) Provisional application No. 60/169,696, filed on Dec. 7, 1999.

(51) Int. Cl.$^7$ .................... H01L 21/425; H01L 21/3205; H01L 21/4763
(52) U.S. Cl. .................. 438/528; 438/585; 438/527; 438/918
(58) Field of Search .................. 438/585, 510, 438/514, 517, 528, 556, 559

(56) References Cited

U.S. PATENT DOCUMENTS

| | | | |
|---|---|---|---|
| 5,879,975 | * | 3/1999 | Karlsson et al. ............... 438/162 |
| 5,882,974 | * | 3/1999 | Gardner et al. ............... 438/286 |
| 5,937,301 | * | 8/1999 | Gardner et al. ............... 438/303 |
| 5,972,751 | * | 10/1999 | Ramsbey et al. .............. 438/257 |
| 6,069,054 | * | 5/2000 | Choi ............................ 438/423 |
| 6,069,062 | * | 5/2000 | Downey ....................... 438/528 |
| 6,136,674 | * | 10/2000 | An et al. ...................... 438/585 |

FOREIGN PATENT DOCUMENTS

410022232 * 1/1998 (JP) .

* cited by examiner

Primary Examiner—John F. Niebling
Assistant Examiner—Viktor Simkovic
(74) Attorney, Agent, or Firm—Lariviere, Grubman & Payne, LLP

(57) ABSTRACT

A method for making a semiconductor device including a silicon substrate includes implanting Nitrogen into the substrate after gate stack formation and before source/drain pant implantation. The Nitrogen is implanted and then annealed as appropriate to establish shallow junction regions and minimal overlap regions in the substrate. Then, the source/drain dopant is implanted and activated, with the dopant essentially being constrained by the Nitrogen to remain concentrated in the shallow junction and minimal overlap regions, thereby minimizing junction capacitance and overlap capacitance in the finished device and consequently improving the speed of operation of the device.

5 Claims, 2 Drawing Sheets

METHOD FOR ESTABLISHING SHALLOW JUNCTION IN SEMICONDUCTOR DEVICE TO MINIMIZE JUNCTION CAPACITANCE

RELATED APPLICATION

This application is related to co-pending Provisional Patent Application Ser. No. 60/169,696, entitled: "METHOD FOR ESTABLISHING SHALLOW JUNCTION IN SEMICONDUCTOR DEVICE TO MINIMIZE JUNCTION CAPACITANCE", filed Dec. 7, 1999, by the same applicant.

TECHNICAL FIELD

The present invention relates to the fabrication of semiconductor devices, and more particularly to reducing transistor capacitances in semiconductor devices.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices. Moreover, it is desirable that the devices operate at very fast speeds.

Among the things that can limit the speed with which semiconductor devices operate is extraneous capacitances in the devices. More specifically, undesired electrical capacitance can arise from the portions of the source and drain regions that overlap the gate region, as well as from the source and drain junctions. To minimize this undesired capacitance, the present invention understands that the thickness of the source/drain junctions preferably is minimized.

The present invention further recognizes that the junctions can be made shallow by using very low source/drain dopant implant energies and very low thermal budgets, i.e., by subsequently activating the dopant using as little thermal energy as possible. However, such techniques, while effective, are limited by current manufacturing constraints.

Another way to limit junction depth and, hence, to decrease junction capacitance is to use so-called "silicon on insulator", or "SOI", technology, in which a layer of oxide is buried in the silicon substrate to act as a stop to dopant diffusion (and, hence, to act as a stop to source/drain junction depth). As understood by the present invention, however, current buried oxide layers can typically be disposed in a substrate no closer than about 1000 Å to the surface of the substrate. Thus, source/drain junctions, even in SOI devices, can still be sufficiently deep to cause speed-limiting junction capacitances.

With the above shortcomings in mind, the present invention makes the critical observation that it is possible to limit the depth of the source/drain junctions in semiconductor devices (and, hence, decrease the junction capacitances) using the novel approach set forth herein.

BRIEF SUMMARY OF THE INVENTION

A method for fabricating a semiconductor device including a substrate includes establishing plural transistor gate stacks on the substrate such that at least one prospective junction region is defined in the substrate between two adjacent stacks, with the prospective junction region defining a desired lower bound. The method then includes disposing Nitrogen into the prospective junction region and annealing the substrate to cause the Nitrogen to agglomerate at a depth relative to the surface of the substrate that is greater than the desired lower bound. Dopant is next implanted into the prospective junction region, and then the substrate is annealed to activate dopant.

Preferably, the act of implanting dopant includes implanting the dopant to a depth of at least the desired lower bound. Also, the preferred method includes annealing the substrate after the act of disposing the Nitrogen and before the act of implanting the dopant. As set forth below in greater detail, a desired minimal overlap region under the gate stacks can be determined and an annealing time and temperature established for annealing the substrate with Nitrogen in response to the determining act, such that overlap capacitance is minimized. The act of annealing the substrate after Nitrogen disposition is established to cause the Nitrogen to diffuse and thereby establish the minimal overlap regions.

Other features of the present invention are disclosed or apparent in the section entitled "DETAILED DESCRIPTION OF THE INVENTION".

BRIEF DESCRIPTION OF DRAWINGS

For understanding of the present invention, reference is made to the accompanying drawing in the following DETAILED DESCRIPTION OF THE INVENTION. In the drawings.

DETAILED DESCRIPTION OF THE INVENTION

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

Figure 1:
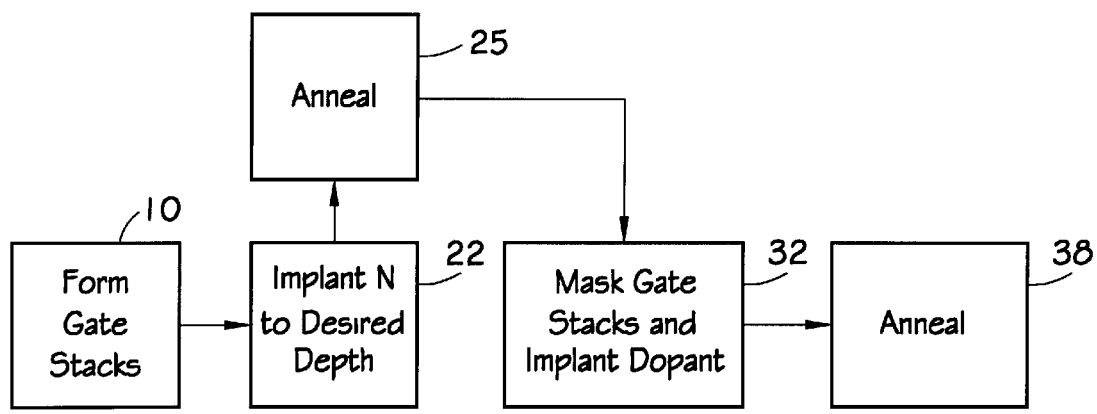
FIG. 1 is a flow chart of the present process.

Referring initially to FIG. 1, at block 10 a semiconductor device 12 (FIG. 2) is provided which includes a silicon substrate 14 having plural gate stacks 16 formed thereon in accordance with conventional principles. As is known in the art, a respective gate insulator layer 17 is established between the gate stacks 16 and the substrate 14. In one preferred embodiment, the device 10 is an SOI device. Accordingly, a buried oxide layer 18 is disposed in the substrate 14, with a portion of the substrate 14 below the buried oxide layer 18 establishing a well 20. The principles advanced herein, however, apply equally to bulk CMOS devices.

Figure 2:
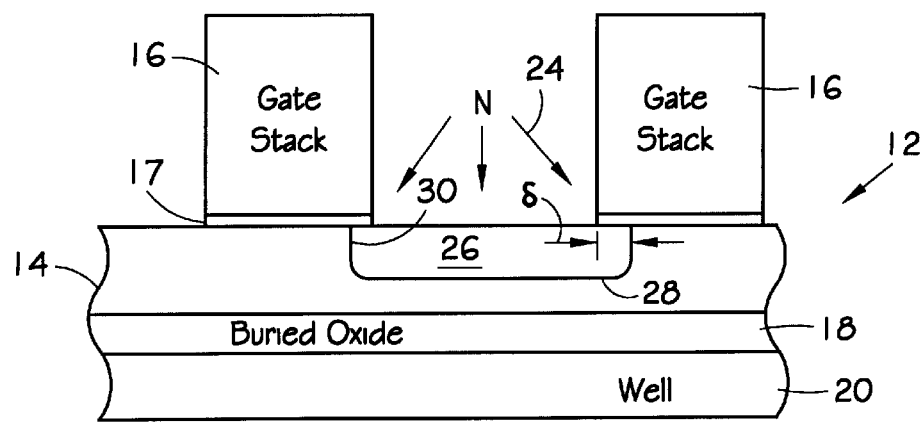
FIG. 2 is a side view of a portion of a semiconductor device made in accordance with the present invention, after Nitrogen implantation and annealing, showing arrows schematically illustrating Nitrogen implant beams.

Moving to block 22 in FIG. 1 and still referring to FIG. 2, Nitrogen is implanted into the substrate 14, as indicated by the arrows 24. The Nitrogen can be implanted using Nitrogen beam techniques. Then, the substrate 14 with Nitrogen is annealed at block 25.

As intended by the present invention, the Nitrogen is implanted into prospective junction regions 26 that are defined in the substrate 14 between two adjacent stacks 16. The implant energy of the Nitrogen and subsequent annealing are established such that the Nitrogen, at the end of the annealing process, agglomerates at the desired prospective junction region 26 predetermined depth from the substrate 14 surface, designated by the line 28.

Moreover, the implant energy and/or annealing time and temperature is established after first determining a minimal source/drain overlap with the gate stacks 16. Some amount of junction/gate overlap is necessary for gate coupling, but the overlap should be minimized to minimize overlap capacitance. Accordingly, the Nitrogen implant energy and/or annealing is established as appropriate such that Nitrogen, after diffusing during annealing, agglomerates to define the border 30 of overlap regions.

In a preferred embodiment, the depth of the prospective junction region 26 is well above the top of the buried oxide layer 18. The depth of the prospective junction regions 26 can be between two hundred Angstroms and seven hundred Angstroms (200 Å–700 Å), and more preferably is four hundred Angstroms (400 Å). Also, the distance δ of overlap is no more than 300 Angstroms, and more preferably is no more than 200 Angstroms. The Nitrogen implant energy can be relatively low, e.g., between one thousand electron volts and twenty thousand electron volts (1 KeV–20 KeV). The annealing can be undertaken at, e.g., one thousand degrees Celsius (1000° C.) using rapid thermal annealing (RTA) or in a furnace.

After Nitrogen implant and annealing, at block 32 in FIG. 1 the gate stacks 16 are covered with, e.g., photoresist 34 (FIG. 3), and then source/drain dopant 36 is implanted into the prospective junction regions 26 using conventional dopant implant techniques. Then, at block 38 the substrate with implanted dopant is annealed to activate the dopant. As recognized herein, the dopant preferentially remains, after annealing, in the prospective junction regions 26 and the overlap regions 30, thereby limiting the depth of the junction regions and size of the overlap regions of the device 10 and, hence, the junction and overlap capacitances.

Figure 3:
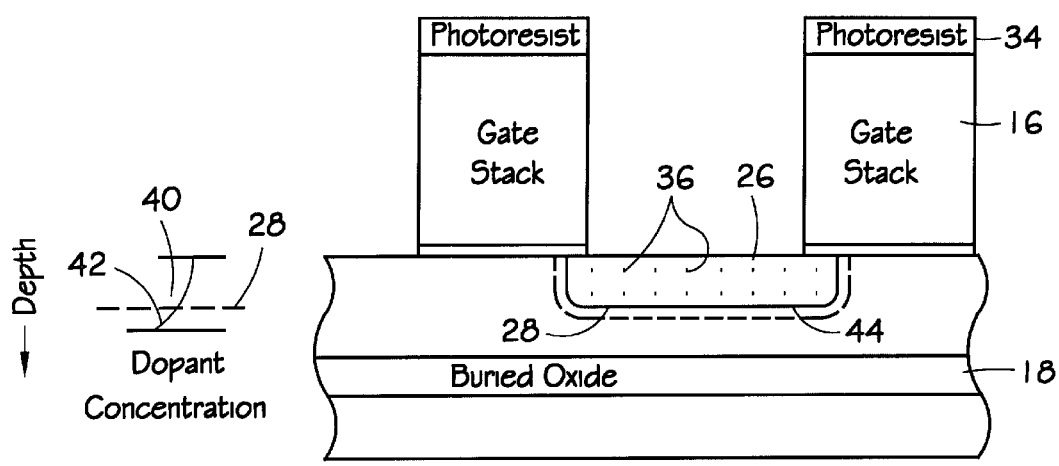
FIG. 3 is a side view of a portion of a semiconductor device made in accordance with the present invention, after source/drain dopant implantation and annealing, shown in juxtaposition with a dopant profile graph illustrating a retrograde profile.

Additionally, as further shown in FIG. 3, a retrograde profile 40 of the concentration of the dopant 36 in the junction regions can be established by appropriately establishing the anneal times and temperatures such that the Nitrogen agglomerates at a depth slightly below the desired junction depth. By "retrograde profile" is meant a dopant concentration profile that advantageously is relatively large and relatively constant from the surface of the substrate 14 to the bottom of the prospective junction regions 26 (i.e., to the line 28), but then rapidly diminishes to zero just outside of the regions 26, as shown by the tail 42 of the profile 40, i.e., in retrograde regions 44. No dopant is disposed in the substrate 14 beyond the retrograde regions 44, which extend from the prospective junction region 26 boundaries to retrograde boundaries, indicated by dashed lines in FIG. 3, that are only a few Angstroms away from the boundaries of the prospective junction regions. This assures a profile that does not have an entirely abrupt end, allowing for a lower contact resistance while still achieving diminished overlap and junction capacitance.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the use of: alternate layer deposition or forming methodologies; etching technologies; masking methods; lithographic methods, passivation and nitridization techniques; as well as alternative semiconductor designs, as well as the application of the technology disclosed herein to alternate electronic components are all contemplated by the principles of the present invention. The invention disclosed herein may be practiced without any element which is not specifically disclosed herein. The use of the singular in the claims does not mean "only one", but rather "one or more", unless otherwise stated in the claims.

What is claimed is:

1. A method for fabricating a semiconductor device, the semiconductor device including a substrate, the method comprising:

establishing plural transistor gate stacks on the substrate such that at least one prospective junction region is defined in the substrate between two adjacent stacks, the prospective junction region defining a desired lower bound;

disposing Nitrogen into the prospective junction region;

annealing the substrate to cause the Nitrogen to agglomerate at a depth greater than the desired lower bound;

implanting dopant into the prospective junction region; then annealing the substrate to activate dopant.

2. The method of claim 1, wherein the act of implanting dopant includes implanting the dopant to a depth of at least the desired lower bound.

3. The method of claim 1, further comprising annealing the substrate after the act of disposing the Nitrogen and before the act of implanting the dopant.

4. The method of claim 1, further comprising:

determining a desired minimal overlap region under the gate stacks; and establishing an annealing time and temperature for annealing the substrate with Nitrogen in response to the determining act, such that overlap capacitance is minimized.

5. The method of claim 4, wherein the act of annealing the substrate after Nitrogen disposition is established to cause the Nitrogen to diffuse and thereby establish the minimal overlap regions.

* * * * *

UNITED STATES PATENT AND TRADEMARK OFFICE
CERTIFICATE OF CORRECTION

PATENT NO. : 6,204,157 B1　　　　　　　　　　　　　　　　　　　　Page 1 of 1
DATED : March 20, 2001
INVENTOR(S) : Effiong Ibok It is certified that error appears in the above-identified patent and that said Letters Patent is hereby corrected as shown below:

<u>Abstract, item [57],</u>
Line 3, delete [pant] and replace with -- dopant --.

Signed and Sealed this

Sixteenth Day of October, 2001

*Attest:*

*Attesting Officer*　　　　　　　NICHOLAS P. GODICI
　　　　　　　　　　　　*Acting Director of the United States Patent and Trademark Office*